(12) United States Patent
Mizutani

(10) Patent No.: US 10,176,906 B2
(45) Date of Patent: Jan. 8, 2019

(54) SHIELDED CONDUCTIVE PATH

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Yoshio Mizutani, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/743,333

(22) PCT Filed: Jun. 30, 2016

(86) PCT No.: PCT/JP2016/069383
§ 371 (c)(1),
(2) Date: Jun. 11, 2018

(87) PCT Pub. No.: WO2017/014017
PCT Pub. Date: Jan. 26, 2017

(65) Prior Publication Data
US 2018/0277282 A1    Sep. 27, 2018

(30) Foreign Application Priority Data

Jul. 21, 2015 (JP) .................... 2015-143825

(51) Int. Cl.
*H01B 7/18* (2006.01)
*H01B 7/22* (2006.01)
*H05K 9/00* (2006.01)

(52) U.S. Cl.
CPC ........... *H01B 7/1875* (2013.01); *H01B 7/226* (2013.01); *H05K 9/0098* (2013.01)

(58) Field of Classification Search
CPC ..... H01B 7/1875; H01B 7/226; H05K 9/0098
(Continued)

(56) References Cited

U.S. PATENT DOCUMENTS 3,051,771 A  *  8/1962  Lee ................... H01B 9/023
                                                    156/47
3,474,186 A  *  10/1969  Hale ................. H01B 9/023
                                                    174/103
(Continued)

FOREIGN PATENT DOCUMENTS

JP   S57-101423 U    6/1982
JP   H10-241925 A    9/1998
JP   2003-068151 A   3/2003

OTHER PUBLICATIONS

Search Report for PCT/JP2016/069383, dated Jul. 26, 2016.

*Primary Examiner* — Timothy Thompson
*Assistant Examiner* — Michael F McAllister
(74) *Attorney, Agent, or Firm* — Honigman Miller Schwartz and Cohn LLP

(57) ABSTRACT

Provided is a shielded conductive path exhibiting a shielding function over a broad frequency band between a low frequency and a high frequency even when the shielding member has a small cross-sectional area. A shielded conductive path includes conductive path main bodies, insulating layers surrounding the conductive path main bodies, and shielding members facing the outer circumferential surfaces of the insulating layers, each have a configuration in which a conductive layer and a magnetic layer are layered together. Electromagnetic noise in a frequency band between a low frequency and an intermediate frequency is blocked with the conductive layer, and electromagnetic noise in a frequency band between an intermediate frequency and a high frequency is blocked with the magnetic layer. The different (Continued)

frequency regions are assigned to the conductive layer and the magnetic layer, and therefore, the cross-sectional areas of the conductive layer and the magnetic layer need not be increased.

1 Claim, 9 Drawing Sheets

(58) Field of Classification Search
USPC .......................................................... 174/108
See application file for complete search history.

(56) References Cited

U.S. PATENT DOCUMENTS

| | | | | |
|---|---|---|---|---|
| 4,268,714 A * | 5/1981 | Mori | ....................... | B32B 15/04 |
| | | | | 174/108 |
| 4,406,914 A * | 9/1983 | Kincaid | ............. | H01B 11/1016 |
| | | | | 174/107 |
| 4,912,283 A * | 3/1990 | O'Connor | .......... | H01B 11/1008 |
| | | | | 174/105 R |
| 5,281,488 A * | 1/1994 | Poulsen | ............... | H01B 7/0018 |
| | | | | 174/117 FF |
| 5,945,764 A * | 8/1999 | Bendfeld | ................. | H02K 3/40 |
| | | | | 174/109 |
| 6,080,935 A * | 6/2000 | Lanoue | ................. | H01F 27/323 |
| | | | | 174/117 F |
| 8,916,775 B2 * | 12/2014 | Tamaki | .............. | H01B 11/1025 |
| | | | | 174/102 R |
| 8,993,883 B2 * | 3/2015 | Kumakura | ............. | H01B 11/20 |
| | | | | 174/109 |
| 9,728,303 B2 * | 8/2017 | Kobayashi | ........... | H01B 11/203 |
| 9,847,154 B2 * | 12/2017 | Grant | ................. | H01B 11/1025 |
| 2004/0055772 A1 * | 3/2004 | Tsutsui | ............... | H01B 11/1016 |
| | | | | 174/36 |
| 2010/0108350 A1 * | 5/2010 | Cases | ..................... | H01B 13/26 |
| | | | | 174/102 R |
| 2011/0247856 A1 * | 10/2011 | Matsuda | .............. | H01B 11/203 |
| | | | | 174/108 |
| 2016/0064119 A1 * | 3/2016 | Grant | ................. | H01B 11/1025 |
| | | | | 439/656 |
| 2016/0155540 A1 * | 6/2016 | Matsuda | .............. | H01B 11/183 |
| | | | | 174/107 |

* cited by examiner

SHIELDED CONDUCTIVE PATH

TECHNICAL FIELD

The present invention relates to a shielded conductive path.

BACKGROUND ART

Patent Document 1 discloses a shielded conductive path having a configuration in which an unshielded electric wire is surrounded by a shielding member constituted by a braided wire obtained by braiding conductive strands into a tubular shape. The shielding function of the shielding member makes it possible to prevent electromagnetic noise caused by the unshielded electric wire from being emitted, and to prevent the external electromagnetic noise from affecting the unshielded electric wire. Not only a shielding member constituted by a braided wire but also a shielding member constituted by a metal foil, a metal pipe, or the like can be expected to exhibit such a shielding function.

CITATION LIST

Patent Documents

Patent Document 1: JP 2006-269666A

SUMMARY OF INVENTION

Technical Problem

Conventional shielding members are made of a single material. Therefore, in order for the shielding member to exhibit a high shielding function over a broad frequency band between a low frequency and a high frequency, the cross-sectional area of the shielding member need to be increased by increasing its thickness or perimeter. However, the increase in the cross-sectional area results in an increase in the weight, size, cost, or the like of the shielding member.

The present invention was accomplished based on the above-mentioned circumstances, and it is an object thereof to provide a shielded conductive path that can exhibit a shielding function over a broad frequency band between a low frequency and a high frequency even when the shielding member has a small cross-sectional area.

Solution to Problem

A shielded conductive path of the present invention includes:
a conductive path main body;
an insulating layer surrounding the conductive path main body; and
a shielding member that faces an outer circumferential surface of the insulating layer and has a configuration in which a conductive layer and a magnetic layer are layered together.

Advantageous Effects of Invention

With the shielded conductive path of the present invention, electromagnetic noise in a frequency band between a low frequency and an intermediate frequency can be blocked with the conductive layer, and electromagnetic noise in a frequency band between an intermediate frequency and a high frequency can be blocked with the magnetic layer. The different frequency regions are assigned to the conductive layer and the magnetic layer, and therefore, the cross-sectional areas of the conductive layer and the magnetic layer need not be increased more than necessary.

DESCRIPTION OF EMBODIMENTS (a) The shielded conductive path of the present invention may also have a configuration in which the shielding member is formed into a tubular shape by winding a flexible layered film member around an outer circumference of the insulating layer in a circumferential direction.

With this configuration, even when a range in which the shielding member surrounds the conductive path main body and the insulating layer is elongated in an axial direction, a simple operation of winding the layered film member in the circumferential direction enables the entire outer circumferences of the conductive path main body and the insulating layer to be surrounded by the shielding member.

(b) The shielded conductive path of the present invention according to (a) may also have a configuration in which the layered film member has a tape shape and is wound around the outer circumference of the insulating layer in a spiral manner.

With this configuration, the layered film member has a tape shape, thus making it possible to reliably surround the entire circumferences of the conductive path main body and the insulating layer even when the wiring route of the conductive path main body includes a curved region or a bent region. Moreover, it is possible to cope with the bending deformation of the conductive path main body.

(c) The shielded conductive path of the present invention according to (b) may also have a configuration in which the conductive layer is provided with a folded-back portion that extends from one lateral edge portion of the conductive layer and covers an outer surface of a lateral edge portion of the magnetic layer, and an inner surface of a lateral edge portion on a side opposite to the folded-back portion in the conductive layer is placed on and is in contact with an outer surface of the folded-back portion.

With this configuration, it is possible to reliably bring the conductive layers into contact in a state in which the layered film member is wound in a spiral manner.

Embodiment 1

Figure 1:
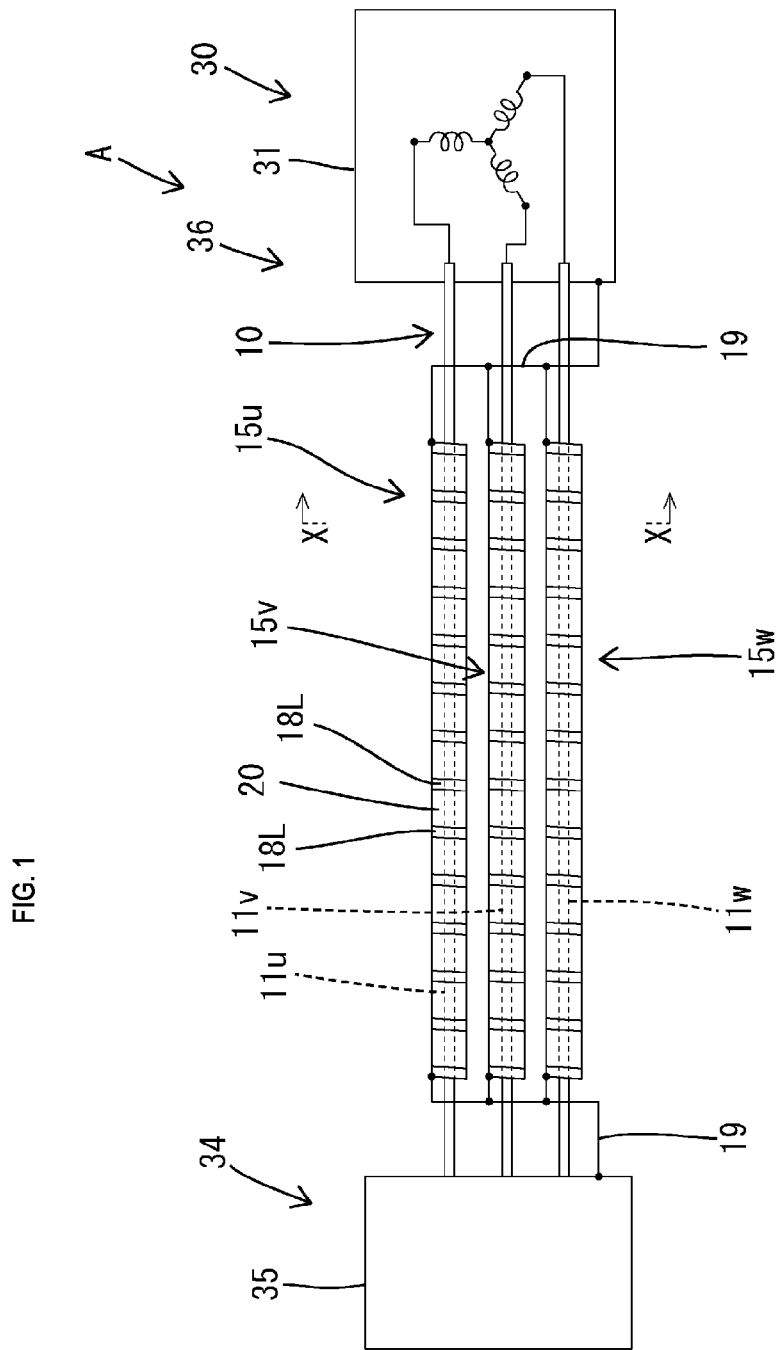
FIG. 1 is a configuration diagram of a shielded conductive path of Embodiment 1.
Figure 2:
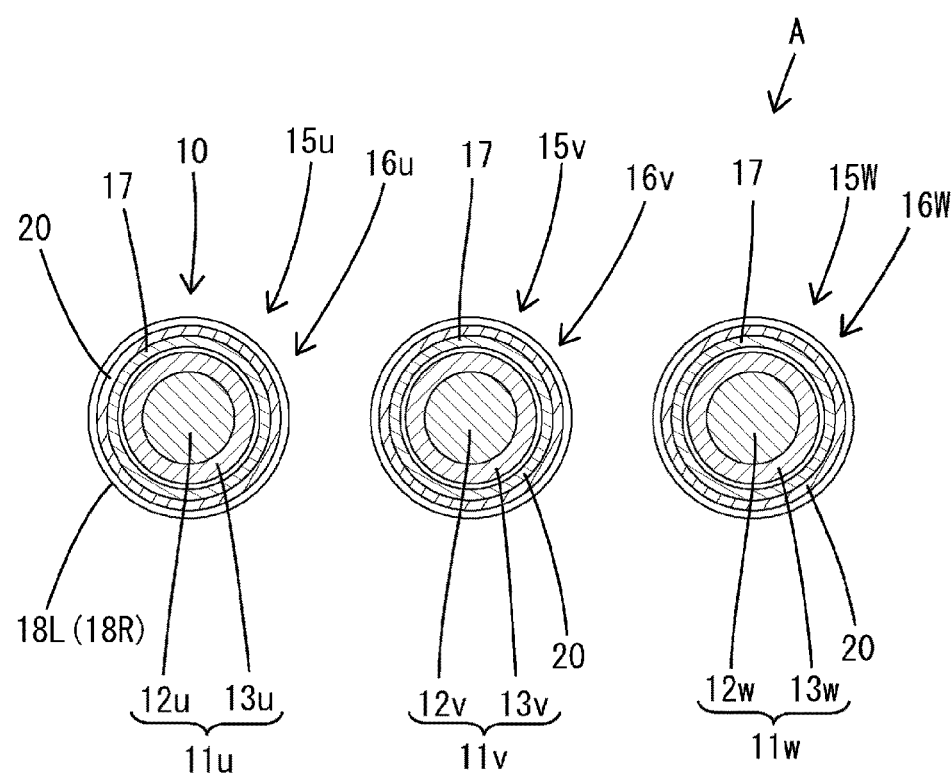
FIG. 2 is a cross-sectional view taken along line X-X in FIG. 1.
Figure 3:
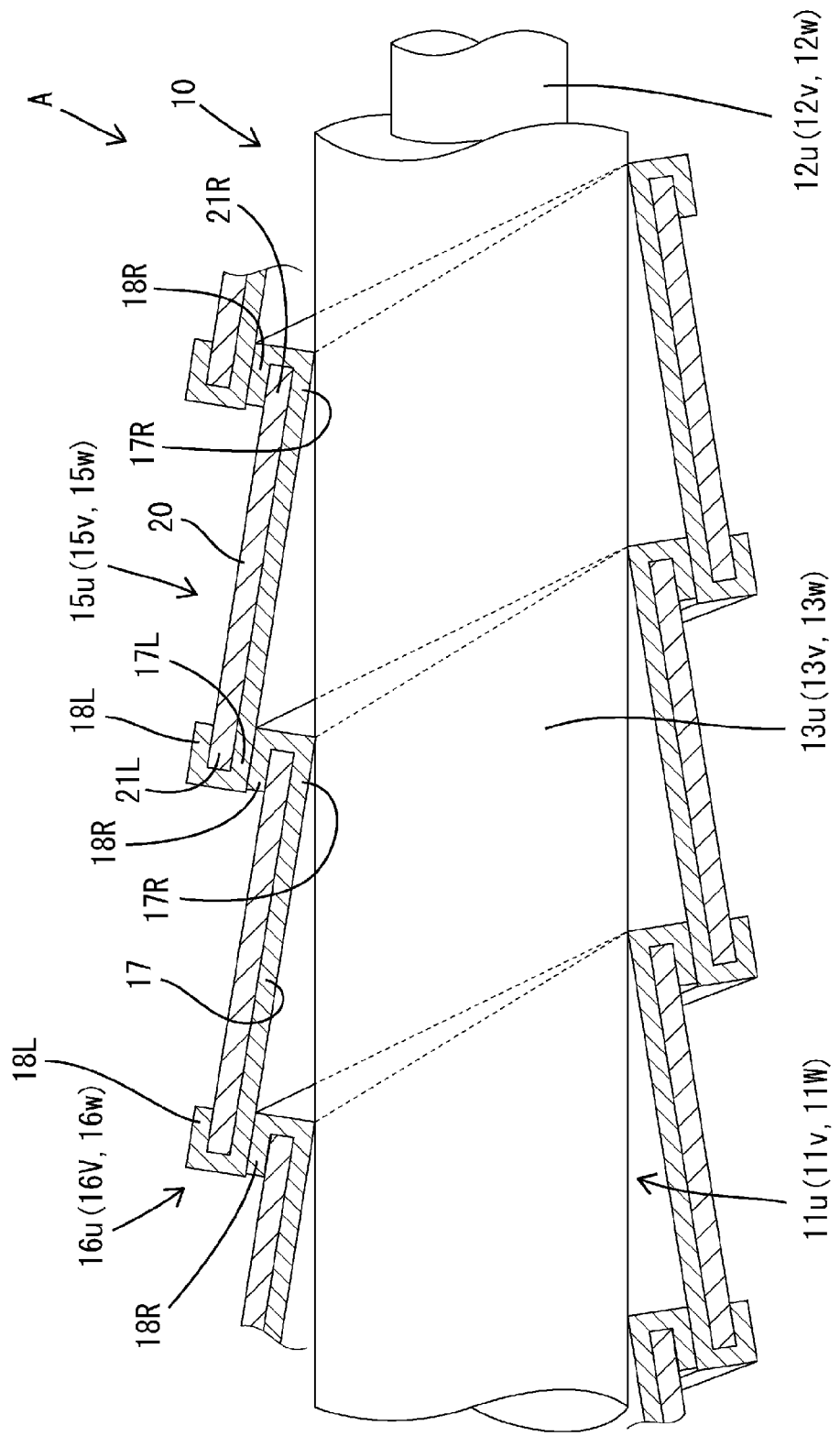
FIG. 3 is a cross-sectional view showing the structure of a shielding member.

Hereinafter, Embodiment 1 in which the present invention is embodied will be described with reference to FIGS. 1 to 3. A shielded conductive path A of Embodiment 1 is arranged between a motor 30 and an inverter device 34 mounted in an electric vehicle (not shown) such as an electric car or a hybrid car. In this electric vehicle, a motor case 31 of the motor 30 and an inverter case 35 of the inverter device 34 function as housing grounds.

The shielded conductive path A includes: a U-phase wire 12u ("conductive path main body" in the claims), a V-phase wire 12v ("conductive path main body" in the claims), and a W-phase wire 12w ("conductive path main body" in the claims) that constitute a three-phase AC circuit 10; a U-phase shielding member 15u ("shielding member" in the claims) for reducing a noise; a V-phase shielding member 15v ("shielding member" in the claims) for reducing a noise; and a W-phase shielding member 15w ("shielding member" in the claims) for reducing a noise.

Each of the U-phase wire 12u, the V-phase wire 12v, and the W-phase wire 12w is constituted by a flexible stranded wire made of metal (e.g., copper, a copper alloy, aluminum, or an aluminum alloy). The outer circumference of the U-phase wire 12u is surrounded by a U-phase insulating coating 13u ("insulating layer" in the claims) made of a synthetic resin. The U-phase wire 12u and the U-phase insulating coating 13u make up one U-phase coated electric wire 11u. The outer circumference of the V-phase wire 12v is surrounded by a V-phase insulating coating 13v ("insulating layer" in the claims) made of a synthetic resin. The V-phase wire 12v and the V-phase insulating coating 13v make up one V-phase coated electric wire 11v. The outer circumference of the W-phase wire 12w is surrounded by a W-phase insulating coating 13w ("insulating layer" in the claims) made of a synthetic resin. The W-phase wire 12w and the W-phase insulating coating 13w make up one W-phase coated electric wire 11w.

The U-phase wire 12u, the V-phase wire 12v, and the W-phase wire 12w are arranged in parallel. One end of each of the U-phase wire 12u, the V-phase wire 12v, and the W-phase wire 12w is connected to an inverter circuit (not shown) of the inverter device 34. The inverter circuit is accommodated inside the conductive inverter case 35, which has a shielding function. The other end of each of the U-phase wire 12u, the V-phase wire 12v, and the W-phase wire 12w is connected to the windings of the motor 30. The windings are accommodated inside the conductive motor case 31, which has a shielding function.

The U-phase shielding member 15u is formed into a tubular shape by winding a flexible U-phase layered film member 16u ("layered film member" in the claims) around the outer circumference of the U-phase coated electric wire 11u in a spiral manner. In the same manner as the U-phase shielding member 15u, the V-phase shielding member 15v is also formed into a tubular shape by winding a flexible V-phase layered film member 16v ("layered film member" in the claims) around the outer circumference of the V-phase coated electric wire 11v in a spiral manner. In the same manner as the U-phase shielding member 15u and the V-phase shielding member 15v, the W-phase shielding member 15w is also formed into a tubular shape by winding a flexible W-phase layered film member 16w ("layered film member" in the claims) around the outer circumference of the W-phase coated electric wire 11w in a spiral manner.

Each of the U-phase layered film member 16u, the V-phase layered film member 16v, and the W-phase layered film member 16w is obtained by layering a conductive layer 17 and a magnetic layer 20 and integrating them into one. The conductive layer 17 is constituted by a metal foil made of copper, a copper alloy, aluminum, an aluminum alloy, or the like and shaped into a flexible tape shape. The magnetic layer 20 is obtained by mixing magnetic powder in a flexible base material made of rubber or a synthetic resin, for example, and shaping the mixture into a flexible tape shape with substantially the same width as that of the conductive layer 17. The magnetic layer 20 is in intimate contact with the outer surface of the conductive layer 17 by a means such as gluing, welding, or the like. It should be noted that a configuration in which the conductive layer 17 and the magnetic layer 20 are not in intimate contact and are not stuck to each other, and can be easily separated or removed from each other is also possible.

A pair of folded-back portions 18L and 18R that extend toward the outer surface side of the magnetic layer 20 along its outer lateral surfaces and further extend along the outer surfaces of lateral edge portions 21L and 21R of the magnetic layer 20 is formed in one piece at lateral edge portions 17L and 17R of the conductive layer 17. The folded-back portions 18L and 18R are also conductive. The folded-back portions 18L and 18R are also in intimate contact with the magnetic layer 20 by a means such as gluing, welding, or the like. It should be noted that a configuration in which the folded-back portions 18L and 18R and the magnetic layer 20 are not in intimate contact and are not stuck to each other, and can be easily separated or removed from each other is also possible.

The tape-like U-phase shielding member 15u is wound around the outer circumference of the U-phase coated electric wire 11u (U-phase insulating coating 13u) in a spiral manner and brought into contact therewith, and is shaped into a tubular shape to surround the entire circumference of the U-phase coated electric wire 11u (U-phase wire 12u). In the same manner as the U-phase shielding member 15u, the V-phase shielding member 15v and the W-phase shielding member 15w are respectively wound around the outer circumferences of the V-phase coated electric wire 11v (V-phase insulating coating 13v) and the W-phase coated electric wire 11w (W-phase insulating coating 13w) in a spiral manner and brought into contact therewith, and are shaped into a tubular shape to respectively surround the entire circumferences of the V-phase coated electric wire 11v (V-phase wire 12v) and the W-phase coated electric wire 11w (W-phase wire 12w).

Each of the shielding member 15u, 15v and 15w is wound in a spiral manner such that, in the conductive layer 17, the inner surface of the lateral edge portion 17L on one side (left side in FIG. 3) of a region that is being wound is layered on and brought into contact with the outer surface of the folded-back portion 18R extending from the lateral edge portion 17R on the other side (right side in FIG. 3) of a previously wound region. If the shielding member is wound in this manner, no gap in the axial direction is formed between a previously wound region and a subsequently wound region.

The shielding members 15u, 15v and 15w respectively surround the entire circumferences of the coated electric wires 11u, 11v and 11w, and regions to be shielded (e.g., region over substantially the entire length) in the coated electric wires 11u, 11v and 11w, and thus exhibit a shielding function. The conductive layers 17 of the shielding members 15u, 15v and 15w are connected to the housing grounds (i.e., the motor case 31 and the inverter case 35) via branch connection wires 19 for a conductive layer.

Next, the functions of Embodiment 1 will be described. The frequency of electromagnetic noise for which shielding measures should be taken is identified, and depending on the frequency, a frequency band of electromagnetic noise to be blocked with the conductive layer 17 and a frequency band of electromagnetic noise to be blocked with the magnetic layer 20 are determined. The material, the thickness, and the like of the conductive layer 17 are selected and determined depending on the frequency band (mainly a band between a low frequency and an intermediate frequency) of the electromagnetic noise to be blocked with the conductive layer 17. Moreover, the material, the mixing density, and the like of the magnetic powder contained in the magnetic layer 20 are selected and determined depending on the frequency band (mainly a band between an intermediate frequency and a high frequency) of the electromagnetic noise to be blocked with the magnetic layer 20.

The shielded conductive path A of Embodiment 1 includes the conductive path main bodies (the U-phase wire 12u, the V-phase wire 12v, the W-phase wire 12w), the insulating layers (the U-phase insulating coating 13u, the V-phase insulating coating 13v, the W-phase insulating coating 13w) surrounding the conductive path main bodies (the U-phase wire 12u, the V-phase wire 12v, the W-phase wire 12w), and the U-phase shielding member 15u, V-phase shielding member 15v and W-phase shielding member 15w that face the outer circumferential surfaces of the insulating layers (the U-phase insulating coating 13u, the V-phase insulating coating 13v, the W-phase insulating coating 13w) and have a configuration in which the conductive layer 17 and the magnetic layer 20 are layered together.

With the shielded conductive path A of Embodiment 1, electromagnetic noise in a frequency band between a low frequency and an intermediate frequency can be blocked with the conductive layer 17, and electromagnetic noise in a frequency band between an intermediate frequency and a high frequency can be blocked with the magnetic layer 20. The different frequency regions are assigned to the conductive layer 17 and the magnetic layer 20, and therefore, the cross-sectional areas of the conductive layer 17 and the magnetic layer 20 need not be increased more than necessary. As a result, the shielded conductive path A of Embodiment 1 can exhibit a shielding function over a broad frequency band between a low frequency and a high frequency even when the shielding members 15u, 15v and 15w have a small cross-sectional area.

The shielding members 15u, 15v and 15w are formed into a tubular shape by winding the flexible layered film members 16u, 16v and 16w around the outer circumferences of the insulating layers 13u, 13v and 13w (coated electric wires 11u, 11v and 11w) in the circumferential direction. With this configuration, even when ranges in which the shielding members 15u, 15v and 15w surround the coated electric wires 11u, 11v, and 11w (conductive path main bodies 12u, 12v and 12w) and the insulating layers 13u, 13v and 13w is elongated in the axial direction, a simple operation of winding the layered film members 16u, 16v and 16w in the circumferential direction enables the entire outer circumferences of the coated electric wires 11u, 11v, and 11w (conductive path main bodies 12u, 12v and 12w) and the insulating layers 13u, 13v and 13w to be surrounded by the shielding members 15u, 15v and 15w.

The layered film members 16u, 16v and 16w have a tape shape and are wound around the outer circumferences of the insulating layers 13u, 13v and 13w in a spiral manner. With this configuration, the layered film members 16u, 16v and 16w have a tape shape, thus making it possible to reliably surround the entire circumferences of the coated electric wires 11u, 11v, and 11w (the conductive path main bodies 12u, 12v and 12w and the insulating layers 13u, 13v and 13w) even when the wiring routes of the coated electric wires 11u, 11v, and 11w (conductive path main bodies 12u, 12v and 12w) include a curved region or a bent region. Moreover, even when the conductive path main bodies 12u, 12v and 12w (coated electric wires 11u, 11v, and 11w) are bent and deformed, the shielding members 15u, 15v and 15w are flexibly deformed following the deformation, and keep surrounding the coated electric wires 11u, 11v and 11w appropriately.

The conductive layer 17 is provided with the folded-back portion 18R that extends from one lateral edge portion 17R of the conductive layer 17 and covers the outer surface of the lateral edge portion 21R of the magnetic layer 20. The inner surface of the lateral edge portion 17L on a side opposite to the folded-back portion 18R of a region of the conductive layer 17 that is being wound is layered on and brought into contact with the outer surface of the folded-back portion 18R of a previously wound region of the conductive layer 17. With this configuration, it is possible to reliably bring the conductive layers 17 into contact in a state in which the shielding members 15u, 15v and 15w are wound in a spiral manner.

Embodiment 2

Figure 4:
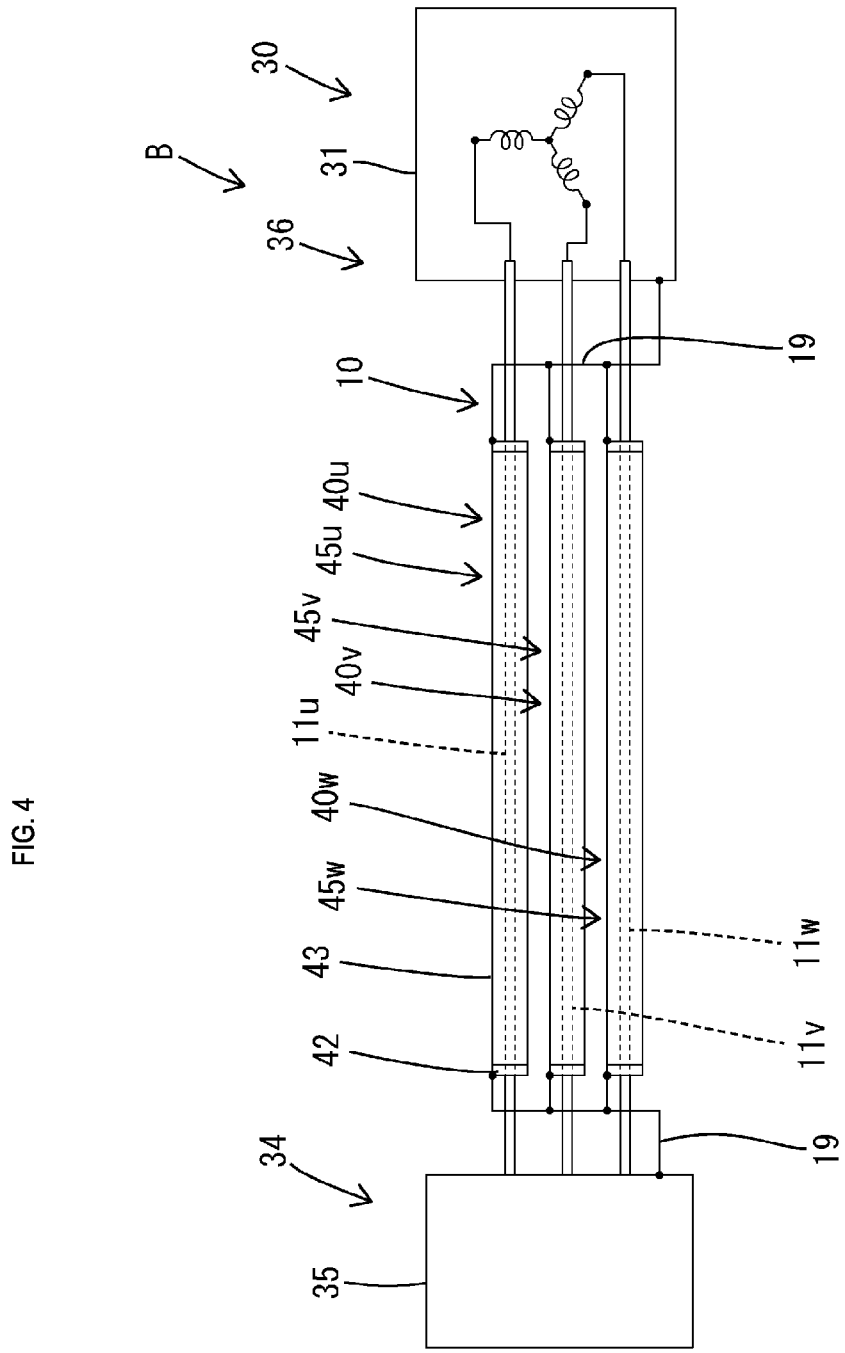
FIG. 4 is a configuration diagram of a shielded conductive path of Embodiment 2.
Figure 5:
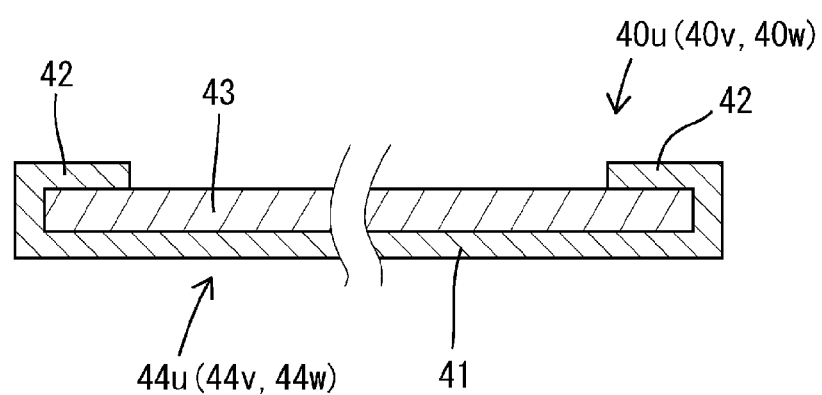
FIG. 5 is a cross-sectional view of a shielding member of Embodiment 2.

Next, Embodiment 2 in which the present invention is embodied will be described with reference to FIGS. 4 and 5. A shielded conductive path B of Embodiment 2 has a configuration that differs from that of Embodiment 1 above in that shielding members 40u, 40v and 40w are used. Other structural aspects are identical to those of Embodiment 1 above. Therefore, identical structural aspects are denoted by identical reference numerals, and descriptions of these structures, functions, and effects are omitted.

Embodiment 2 differs from Embodiment 1 in that the U-phase shielding member 40u, the V-phase shielding member 40v, and the W-phase shielding member 40w have not a tape shape but a rectangular sheet shape, but, in the same manner as in Embodiment 1, the U-phase shielding member 40u, the V-phase shielding member 40v, and the W-phase shielding member 40w are constituted by a flexible U-phase layered film member 44u, a flexible V-phase layered film member 44v, and a flexible W-phase layered film member 44w that each have a configuration in which a magnetic layer 43 is layered on the outer circumference of a conductive layer 41 provided with folded-back portions 42 and integrated with the conductive layer 41.

The lengths of the long sides of the layered film members 44u, 44v and 44w are set to be the same as the lengths of regions to be surrounded by the shielding members 40u, 40v and 40w in the U-phase coated electric wire 11u, the V-phase coated electric wire 11v, and the W-phase coated electric wire 11w. The lengths of the short sides of the shielding members 40u, 40v and 40w are set to be the same as the perimeters of the coated electric wires 11u, 11v and 11w. The tubular shielding members 40u, 40v and 40w are formed by winding the layered film members 44u, 44v and 44w around the outer circumferences of the coated electric wires 11u, 11v and 11w, respectively. The entire regions of the inner surfaces of the conductive layers 41 may or may not be in intimate contact with the outer circumferential surfaces of the coated electric wires 11u, 11v and 11w (insulating coatings 13u, 13v and 13w) in a state in which the layered film members 44u, 44v and 44w are wound around the coated electric wires 11u, 11v and 11w.

Embodiment 3

Figure 6:
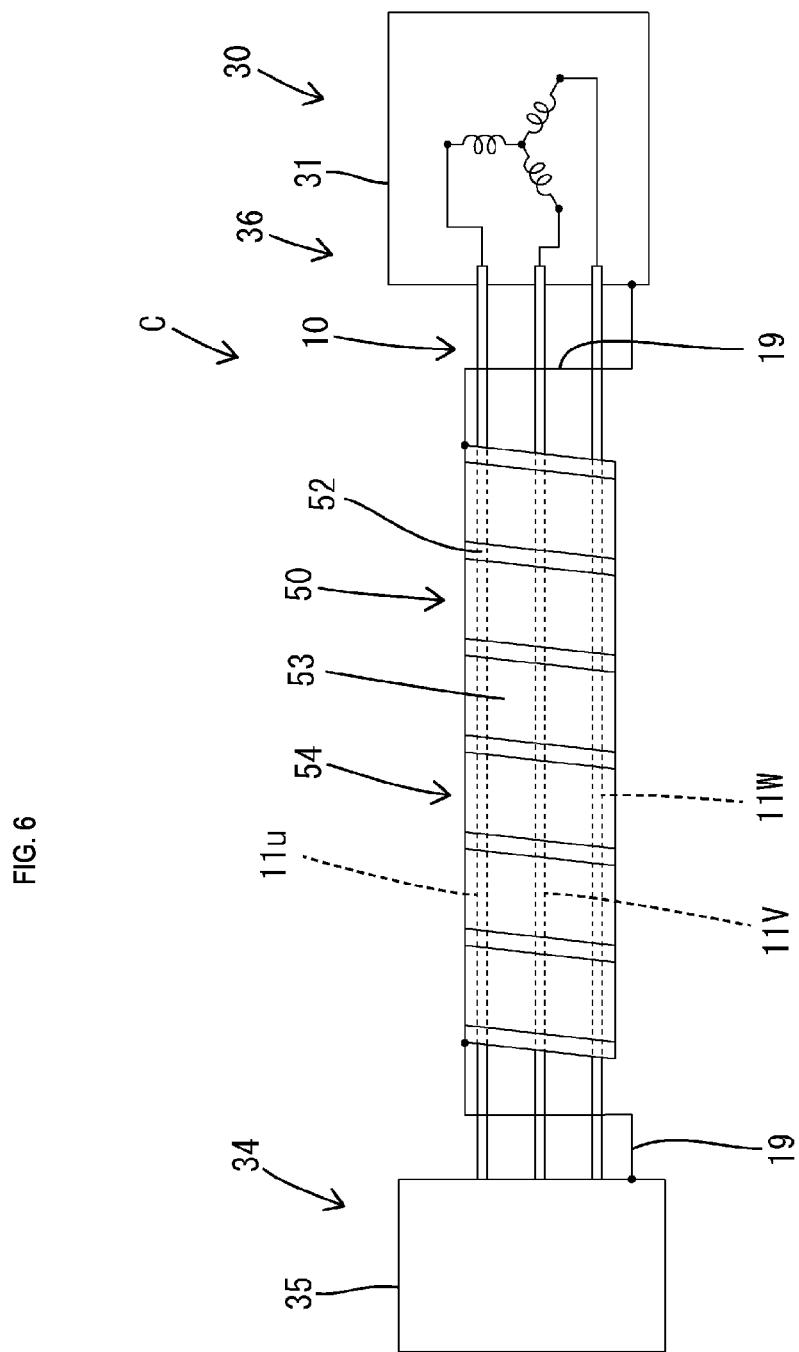
FIG. 6 is a configuration diagram of a shielded conductive path of Embodiment 3.
Figure 7:
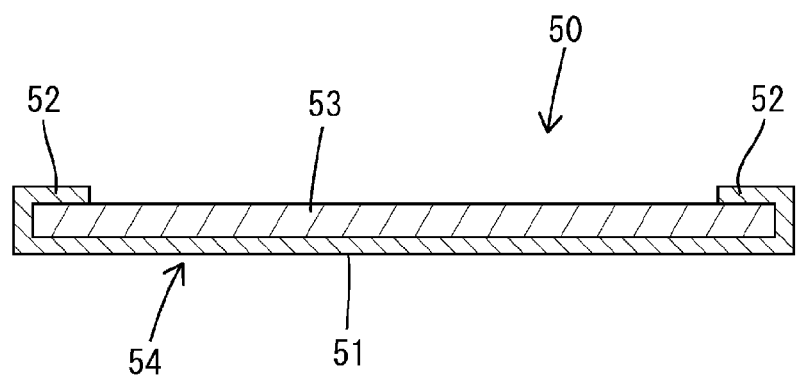
FIG. 7 is a cross-sectional view of a shielding member of Embodiment 3.

Next, Embodiment 3 in which the present invention is embodied will be described with reference to FIGS. 6 and 7.

A shielded conductive path C of Embodiment 3 has a configuration that differs from those of Embodiments 1 and 2 above in that a shielding member 50 is used. Other structural aspects are identical to those of Embodiments 1 and 2 above. Therefore, identical structural aspects are denoted by identical reference numerals, and descriptions of these structures, functions, and effects are omitted.

In Embodiment 3, a single shielding member 50 surrounds the U-phase coated electric wire 11u (U-phase wire 12u), the V-phase coated electric wire 11v (V-phase wire 12v), and the W-phase coated electric wire 11w (W-phase wire 12w) all together. It should be noted that, as a matter of convenience, the U-phase coated electric wire 11u, the V-phase coated electric wire 11v, and the W-phase coated electric wire 11w are shown to be separated from one another in FIG. 6, but these three coated electric wires 11u, 11v and 11w are arranged in parallel in a side-by-side arrangement or in a pyramid arrangement.

The shielding member 50 is constituted by a flexible tape-like layered film member 54 that has a configuration in which a magnetic layer 53 is layered on the outer circumference of a conductive layer 51 provided with folded-back portions 52 and integrated with the conductive layer 51 in the same manner as the shielding members 15u, 15v and 15w of Embodiment 1. The tubular shielding member 50 is formed by winding this layered film member 54 around the bundle of the coated electric wires 11u, 11v and 11w in a spiral manner.

Embodiment 4

Figure 8:
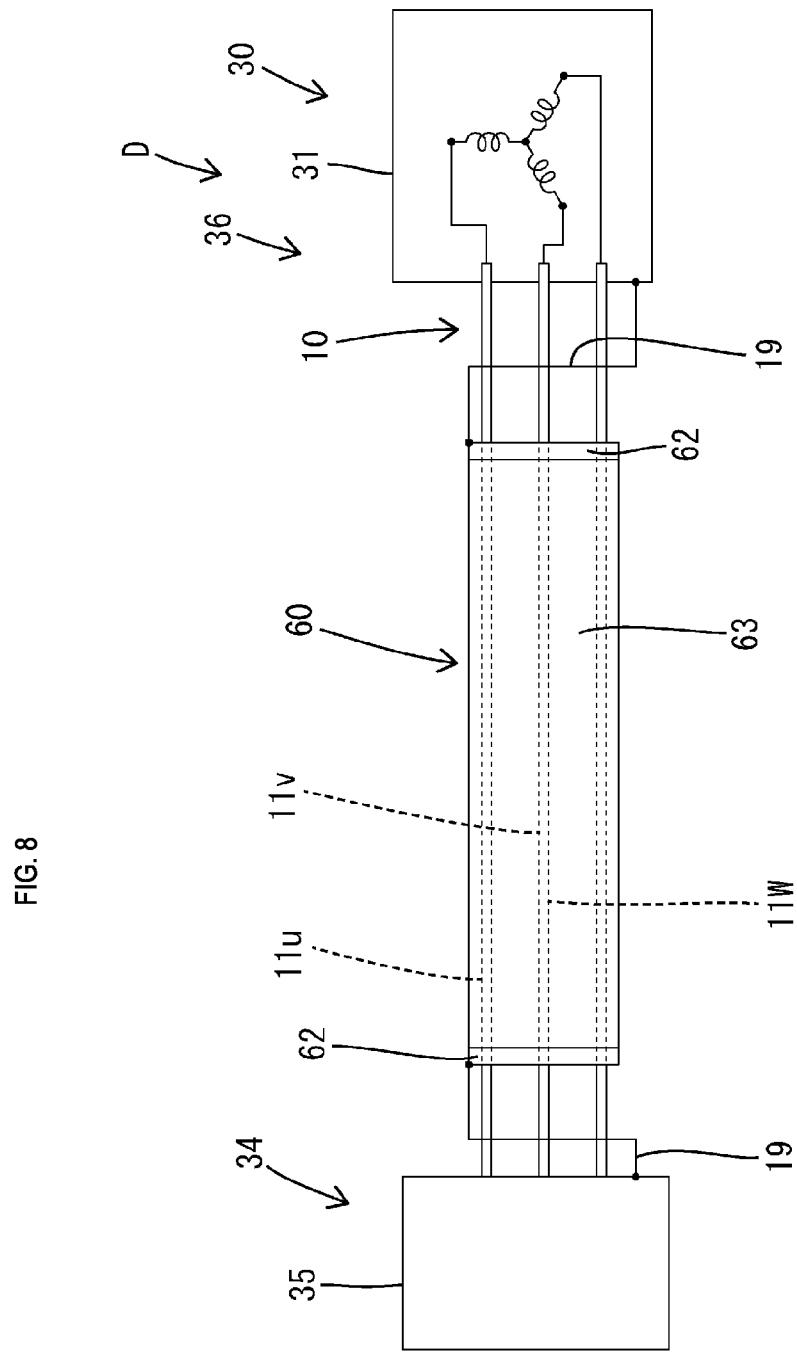
FIG. 8 is a configuration diagram of a shielded conductive path of Embodiment 4.
Figure 9:
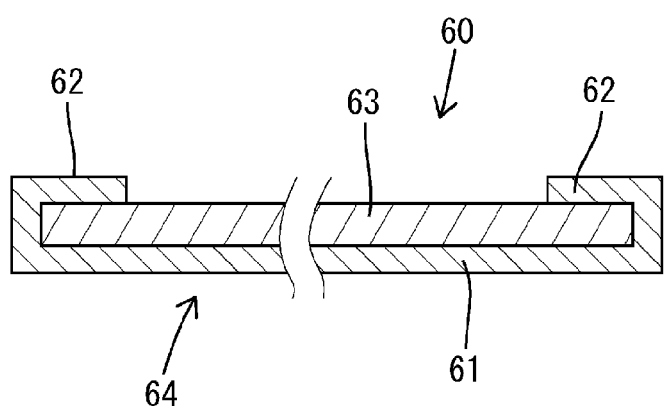
FIG. 9 is a cross-sectional view of a shielding member of Embodiment 4.

Next, Embodiment 4 in which the present invention is embodied will be described with reference to FIGS. 8 and 9. A shielded conductive path D of Embodiment 4 has a configuration that differs from those of Embodiments 1 to 3 above in that a shielding member 60 is used. Other structural aspects are identical to those of Embodiments 1 to 3 above. Therefore, identical structural aspects are denoted by identical reference numerals, and descriptions of these structures, functions, and effects are omitted.

In Embodiment 4 as well, in the same manner as in Embodiment 3, a single shielding member 60 surrounds the U-phase coated electric wire 11u (U-phase wire 12u), the V-phase coated electric wire 11v (V-phase wire 12v), and the W-phase coated electric wire 11w (W-phase wire 12w) all together. It should be noted that, as a matter of convenience, the U-phase coated electric wire 11u, the V-phase coated electric wire 11v, and the W-phase coated electric wire 11w are shown to be separated from one another in FIG. 8, but these three coated electric wires 11u, 11v and 11w are arranged in parallel in a side-by-side arrangement or in a pyramid arrangement. The shielding member is constituted by a layered film member 64 with a rectangular sheet shape that has a configuration in which a magnetic layer 63 is layered on the outer circumference of a conductive layer 61 provided with folded-back portions 62 and integrated with the conductive layer 61 in the same manner as in Embodiment 2.

The length of the long side of the layered film members 64 is set to be the same as the lengths of regions to be surrounded by the shielding member 60 in the U-phase coated electric wire 11u, the V-phase coated electric wire 11v, and the W-phase coated electric wire 11w. The length of the short side of the layered film member 64 is set to be equivalent to one cycle of the outer circumference of a bundle of the three coated electric wires 11u, 11v and 11w. The tubular shielding member 60 formed by winding the layered film member 64 around the outer circumferences of the three coated electric wires 11u, 11v and 11w all together. A portion of the inner surface of the conductive layer 61 may or may not be in intimate contact with a portion of the outer circumferential surfaces of the three insulated coatings 13u, 13v and 13w in a state in which the layered film member 64 is wound around the coated electric wires 11u, 11v and 11w.

Other Embodiments

The present invention is not limited to the embodiments that have been described above with reference to the drawings, and embodiments such as those described below are also included in the technical scope of the present invention, for example.

(1) Although, in Embodiments 1 to 4 above, the pair of folded-back portions extend from the two lateral edges of the conductive layer, a configuration in which the folded-back portion extends from only one of the lateral edge portions is also possible.

(2) Although, in Embodiments 1 to 4 above, the folded-back portions are formed by folding back the two lateral edge portions of the conductive layer, a configuration in which such folded-back portions are not formed is also possible.

(3) Although, in Embodiments 1 to 4 above, the conductive layer is arranged on the inner circumferential side and the magnetic layer is layered on the outer surface of the conductive layer, a configuration in which the magnetic layer is arranged on the inner circumferential side and the conductive layer is layered on the outer surface of the magnetic layer in contrast is also possible. Also in this case, forming a shielding member in a tape shape and providing folded-back portions facing inward with the conductive layer make it possible to reliably bring the adjacent wound regions of the conductive layer into contact with each other.

(4) Although, in Embodiments 1 to 4 above, the three conductive path main bodies constituting the three-phase AC circuit are star-connected in the motor, the present invention can also be applied to a case where three conductive path main bodies constituting a three-phase AC circuit are delta-connected.

(5) Although, in Embodiments 1 to 4 above, the three conductive path main bodies constitute the three-phase AC circuit, the present invention can also be applied to a case where the conductive path main bodies do not constitute a three-phase AC circuit.

(6) Although, in Embodiments 1 to 4 above, the number of the conductive path main bodies is three, the present invention can also be applied to a case where the number of the conductive path main bodies is one, two, or four or more.

(7) Although, in Embodiments 1 to 4 above, the flexible stranded wires having a circular cross section are used as the conductive path main bodies, single-core wires that are less likely to be deformed, busbars that are not deformed easily, flat cables in which a plurality of electric wires are arranged in parallel, or the like may also be used.

(8) Although, in Embodiments 1 to 4 above, the shielded conductive path is arranged between the motor and the inverter device, the present invention can also be applied to a case where the shielded conductive path is to be connected to devices other than the motor and the inverter device.

(9) Although, in Embodiments 1 to 4 above, the connection wires for a conductive layer are connected to the motor case and the inverter case, the connection wires for a conductive layer may be connected to other housing grounds such as a vehicle body instead of the motor case and the inverter case.

(10) Although, in Embodiments 1 to 4 above, the shielding member has a configuration in which the flexible layered film member is wound around the outer circumferences of the coated electric wires (insulating layers) in the circumferential direction, a configuration in which coated electric wires are inserted into a shielding member that has been shaped into a tubular shape. In this case, the shielding member may be a tubular member that can be deformed or a pipe member that is less likely to be deformed.

(11) Although, in Embodiments 1 to 4 above, each of the conductive layers corresponds to the coated electric wire (insulating layer) and surrounds the entire circumference thereof, each of the conductive layers may be configured to correspond to only a partial region of the coated electric wire in a circumferential direction.

(12) Although, in Embodiments 1 to 4 above, the tape-like or sheet-like metal foils are used as the conductive layers, there is no limitation thereto, and braided wires, sheet-like core materials or tape-like core materials with a plated surface, sheet-like or tape-like conductive resins, sheet-like or tape-like conductive rubbers, or the like may also be used as the conductive layers.

(13) Although, in Embodiments 1 to 4 above, the magnetic layers surround the entire circumference of the coated electric wires (the conductive path main bodies and the insulating layers), a configuration in which the magnetic layers face only portions in the circumferential direction of the coated electric wires.

(14) Although, in Embodiments 1 and 3 above, the conductive path main bodies (coated electric wires) and the shielding members are arranged in substantially a linear manner, the present invention can also be applied to a case where the wiring routes of the conductive path main bodies (coated electric wires) and the shielding members include a curved region or a bent region. In this case, winding the tape-like layered film member in a spiral manner such that layered areas of the layered film member at the inner region of a bent portion is increased makes it possible to prevent a gap in the axial direction from being formed between the wound portions of the layered film member at the outer region of the bent portion.

(15) Although, in Embodiments 1 to 4 above, the magnetic layer is obtained by mixing magnetic powder in a flexible base material made of rubber or a synthetic resin, for example, the magnetic layer may also be obtained by applying a magnetic paint onto a base material, for example.

(16) Although, in Embodiments 1 to 4 above, the connection wires for a conductive layer are used as means for connecting the conductive layers to the housing ground, there is no limitation thereto, and connectors may also be used as means for connecting the conductive layers to the housing ground, or the conductive layers may also be connected directly to the housing ground without using the connection wires for a conductive layer.

LIST OF REFERENCE NUMERALS

A, B, C, D . . . Shielded conductive path
$12u$ . . . U-phase wire (conductive path main body)
$12v$ . . . V-phase wire (conductive path main body)
$12w$ . . . W-phase wire (conductive path main body)
$13u$ . . . U-phase insulating coating (insulating layer)
$13v$ . . . V-phase insulating coating (insulating layer)
$13w$ . . . W-phase insulating coating (insulating layer)
$15u$, $40u$ . . . U-phase shielding member (shielding member)
$15v$, $40v$ . . . V-phase shielding member (shielding member)
$15w$, $40w$ . . . W-phase shielding member (shielding member)
$16u$, $44u$ . . . U-phase layered film member (layered film member)
$16v$, $44v$ . . . V-phase layered film member (layered film member)
$16w$, $44w$ . . . W-phase layered film member (layered film member)
17, 41, 51, 61 . . . Conductive layer
17L . . . Lateral edge portion on a side opposite to folded-back portion in conductive layer
17R . . . One lateral edge portion of conductive layer
18L, 18R, 42, 52, 62 . . . Folded-back portion
20, 43, 53, 63 . . . Magnetic layer
21R . . . Lateral edge portion of magnetic layer
50, 60 . . . Shielding member
54, 64 . . . Layered film member

The invention claimed is:

1. A shielded conductive path comprising:
a conductive path main body;
an insulating layer surrounding the conductive path main body; and
a shielding member facing an outer circumferential surface of the insulating layer,
wherein the shielding member is formed into a tubular shape by winding a flexible tape-shaped layered film member around an outer circumference of the insulating layer in a spiral manner, the layered film member being formed by layering a conductive layer having a shielding function and a magnetic layer having a shielding function,
a pair of folded-back portions extending from two lateral edge portions of the conductive layer cover outer surfaces of two lateral edge portions of the magnetic layer in an intimate contact state, and
an inner surface of a lateral edge portion on a side opposite to the folded-back portion in the conductive layer is placed on and is in contact with an outer surface of the folded-back portion.

* * * * *